(12) United States Patent
Tamura et al.

(10) Patent No.: US 9,595,462 B2
(45) Date of Patent: Mar. 14, 2017

(54) PEELING SYSTEM

(71) Applicant: Tokyo Electron Limited, Tokyo (JP)

(72) Inventors: Takeshi Tamura, Kumamoto (JP);
Akira Fukutomi, Kumamoto (JP);
Yasuharu Iwashita, Kumamoto (JP);
Masaaki Umitsuki, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 134 days.

(21) Appl. No.: 14/538,180

(22) Filed: Nov. 11, 2014

(65) Prior Publication Data
US 2015/0136331 A1    May 21, 2015

(30) Foreign Application Priority Data

Nov. 19, 2013  (JP) ................. 2013-239186

(51) Int. Cl.
*B32B 38/10* (2006.01)
*H01L 21/683* (2006.01)
(Continued)

(52) U.S. Cl.
CPC ........ *H01L 21/6835* (2013.01); *B32B 43/006* (2013.01); *H01L 21/67051* (2013.01);
(Continued)

(58) Field of Classification Search
CPC . B32B 38/10; B32B 43/006; Y10T 156/1168; Y10T 156/1978; Y10S 156/93; Y10S 156/941; H01L 21/67703; H01L 21/67715; H01L 21/67727; H01L 2221/68381; H01L 2221/68386
See application file for complete search history.

(56) References Cited

U.S. PATENT DOCUMENTS 8,016,537 B2 *  9/2011  Watanabe ......... H01L 21/67207
                                                414/217
8,893,650 B2 * 11/2014  Kaneda ............ H01L 21/67115
                                                118/712
(Continued)

FOREIGN PATENT DOCUMENTS

JP       11-330037 A     11/1999
JP     2012-146756 A      8/2012
(Continued)

*Primary Examiner* — Mark A Osele
(74) *Attorney, Agent, or Firm* — Abelman, Frayne & Schwab

(57) ABSTRACT

Disclosed is a peeling system which includes a peeling device, a plurality of first cleaning devices, an inversion device, a second cleaning device, and first to third conveyance devices. The peeling device is configured to separate a superimposed substrate into a first substrate and a second substrate. The plurality of first cleaning devices is configured to clean a bonded surface of the first substrate. The inversion device configured to invert front and rear surfaces of the first substrate. The second cleaning device is configured to clean a non-bonded surface of the first substrate. Delivery positions of the first substrate in the plurality of first cleaning devices are arranged in a region where an operation range of the first conveyance device and an operation range of the second conveyance device overlap each other.

10 Claims, 8 Drawing Sheets

(51) Int. Cl.
   *H01L 21/67* (2006.01)
   *B32B 43/00* (2006.01)
   *H01L 21/677* (2006.01)
   *B32B 38/16* (2006.01)
   *H01L 23/544* (2006.01)

(52) U.S. Cl.
   CPC .. *H01L 21/67092* (2013.01); *H01L 21/67715* (2013.01); *H01L 21/67727* (2013.01); *B32B 38/162* (2013.01); *B32B 2457/14* (2013.01); *H01L 23/544* (2013.01); *H01L 2221/68327* (2013.01); *H01L 2221/68381* (2013.01); *H01L 2221/68386* (2013.01); *H01L 2223/54433* (2013.01); *H01L 2924/0002* (2013.01); *Y10S 156/93* (2013.01); *Y10S 156/941* (2013.01); *Y10T 156/1168* (2015.01); *Y10T 156/19* (2015.01); *Y10T 156/1978* (2015.01)

(56) References Cited

U.S. PATENT DOCUMENTS

| | | | |
|---|---|---|---|
| 2008/0044258 A1* | 2/2008 | Akechi | H01L 21/67132 414/217.1 |
| 2013/0269879 A1* | 10/2013 | Hirakawa | H01L 21/67051 156/711 |
| 2015/0343755 A1* | 12/2015 | Honda | B32B 43/006 156/714 |

FOREIGN PATENT DOCUMENTS

| | | |
|---|---|---|
| JP | 2013-149657 A | 8/2013 |
| JP | 2013-214676 A | 10/2013 |

* cited by examiner

PEELING SYSTEM

CROSS-REFERENCE TO RELATED APPLICATIONS

This application is based on and claims priority from Japanese Patent Application No. 2013-239186, filed on Nov. 19, 2013, with the Japan Patent Office, the disclosure of which is incorporated herein in its entirety by reference.

TECHNICAL FIELD

The present disclosure relates to a peeling system.

BACKGROUND

For example, in a semiconductor device manufacturing process, the diameter of a semiconductor substrate such as, for example, a silicon wafer or a compound semiconductor wafer has recently been increased, and also, the thickness of the semiconductor substrate has recently been decreased. A thin large-diameter semiconductor substrate may warp or crack when it is conveyed or polished. Accordingly, the semiconductor substrate is reinforced by bonding a supporting substrate thereto, and conveyed or polished, and then, the supporting substrate is separated from the semiconductor substrate. See, e.g., Japanese Laid-Open Patent Publication No. 2012-146756.

Japanese Laid-Open Patent Publication No. 2012-146756 discloses a peeling system in which a peeling device configured to separate the supporting substrate from the semiconductor substrate, a cleaning device configured to clean bonded surfaces of the semiconductor substrate and the supporting substrate after separation, an inversion device configured to invert the front and rear surfaces of the separated semiconductor substrate, and a rear surface cleaning device configured to clean a rear surface (a non-bonded surface) of the semiconductor substrate are integrally incorporated.

SUMMARY

The present disclosure provides a peeling system for separating a superimposed substrate including a first substrate bonded to a second substrate into the first substrate and the second substrate. The peeling system includes: a peeling device configured to separate the superimposed substrate into the first substrate and the second substrate; a plurality of first cleaning devices configured to clean a bonded surface of the first substrate which was bonded to the second substrate; an inversion device configured to invert front and rear surfaces of the first substrate; a second cleaning device configured to clean a non-bonded surface of the first substrate; a first conveyance device configured to take out the first substrate from the peeling device and convey the first substrate into the plurality of first cleaning devices by rotation around a vertical axis and extension and retraction in a horizontal direction; a second conveyance device configured to take out the first substrate from the plurality of first cleaning devices and convey the first substrate into the inversion device by the rotation and the extension and retraction; and a third conveyance device configured to take out the first substrate from the inversion device and convey the first substrate into the second cleaning device by the rotation and the extension and retraction. Delivery positions of the first substrate in the plurality of first cleaning devices are arranged in a region where an operation range of the first conveyance device and an operation range of the second conveyance device overlap each other.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
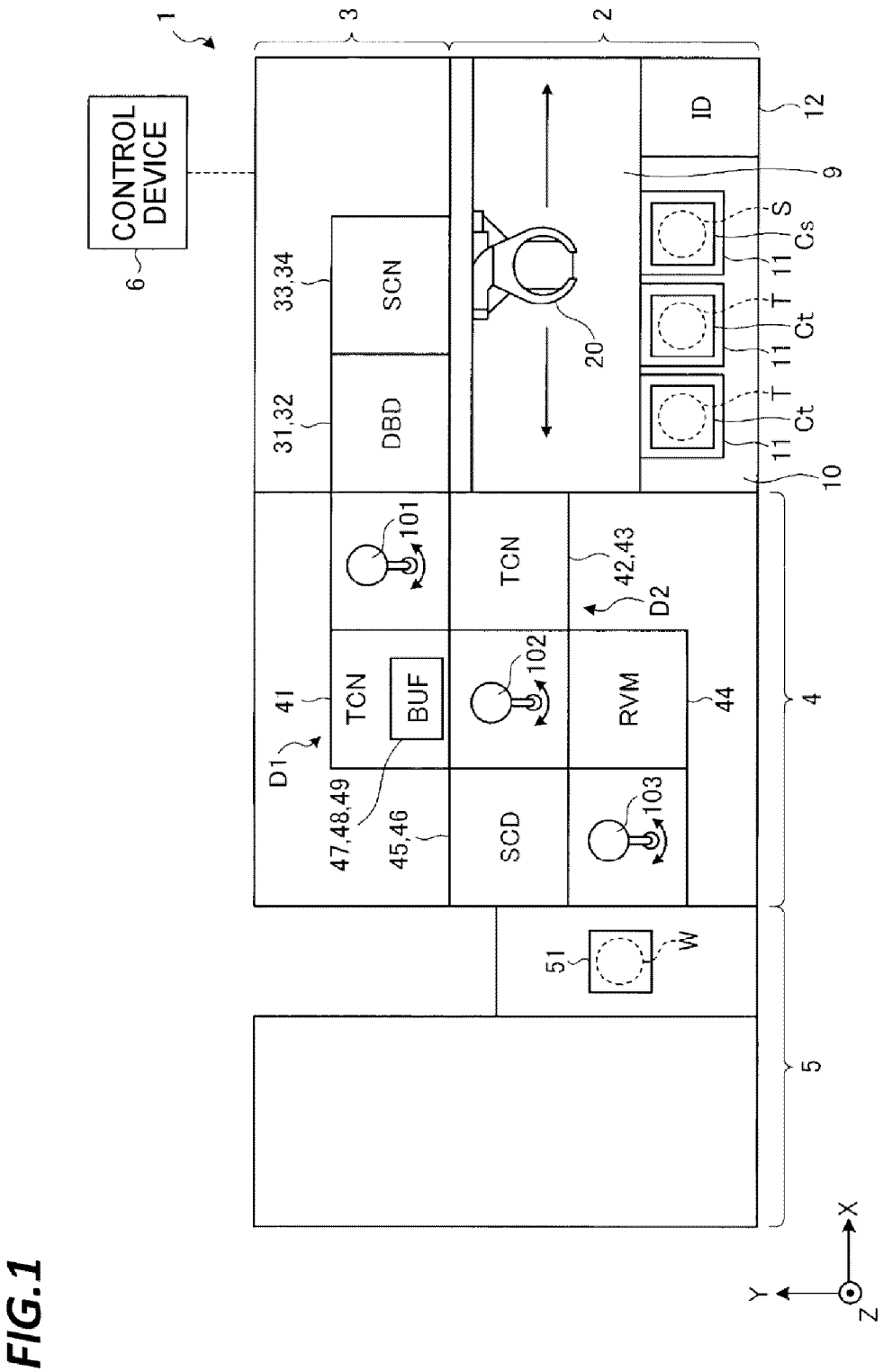
FIG. 1 is a schematic plan view illustrating a configuration of a peeling system according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described conventional peeling system, there is a room for further improvement to improve the throughput.

An object of an aspect of the present disclosure is to provide a peeling system which improves the throughput.

An aspect of the present disclosure is to provide a peeling system for separating a superimposed substrate including a first substrate bonded to a second substrate into the first substrate and the second substrate. The peeling system includes: a peeling device configured to separate the superimposed substrate into the first substrate and the second substrate; a plurality of first cleaning devices configured to clean a bonded surface of the first substrate which was bonded to the second substrate; an inversion device configured to invert front and rear surfaces of the first substrate; a second cleaning device configured to clean a non-bonded surface of the first substrate; a first conveyance device configured to take out the first substrate from the peeling device and convey the first substrate into the plurality of first cleaning devices by rotation around a vertical axis and extension and retraction in a horizontal direction; a second conveyance device configured to take out the first substrate from the plurality of first cleaning devices and convey the first substrate into the inversion device by the rotation and the extension and retraction; and a third conveyance device configured to take out the first substrate from the inversion device and convey the first substrate into the second cleaning device by the rotation and the extension and retraction. Delivery positions of the first substrate in the plurality of first cleaning devices are arranged in a region where an operation range of the first conveyance device and an operation range of the second conveyance device overlap each other.

The plurality of first cleaning devices is disposed separately in a first place and a second place different from the first place. The first conveyance device is disposed between the peeling device and the first place. The second place is arranged to be aligned with the first conveyance device along a second direction which is perpendicular to a first direction in a plan view, the first direction being an arrangement direction of the peeling device, the first conveyance device, and the first place. The second conveyance device is disposed at a location aligned with the first place along the second direction and aligned with the second place along the first direction.

The inversion device is disposed to be aligned with the second conveyance device along the second direction at a side of the second conveyance device which is opposite to a side where the first place is arranged. The third conveyance device is disposed to be aligned with the inversion device along the first direction. The second cleaning device is disposed to be aligned with the third conveyance device along the second direction One of the plurality of first cleaning devices is disposed in one of the first place and the second place, and two of the plurality of first cleaning devices are disposed to be stacked in the other.

The peeling system further includes a temporary mounting unit configured to temporarily mount the first substrate after separation. The temporary mounting unit is disposed above one of the plurality of first cleaning devices disposed in the first place or the second place.

The peeling system further includes a frame mounting device configured to mount a dicing frame on the first substrate after separation. A delivery position of the first substrate in the frame mounting device is arranged within an operation range of the third conveyance device.

The first conveyance device, the second conveyance device, and the third conveyance device eject a gas to generate a negative pressure between the first substrate and the first conveyance device, and between the second conveyance device and the third conveyance device so that the first substrate is held in a non-contact manner.

The second conveyance device is disposed such that a non-rotation region is directed toward the second cleaning device.

According to an aspect of the present disclosure, the throughput may be improved.

Hereinafter, exemplary embodiments of a peeling system according to the present disclosure will be described in detail with reference to accompanying drawings. The present disclosure is not limited to the exemplary embodiments as described below.

Figure 2:
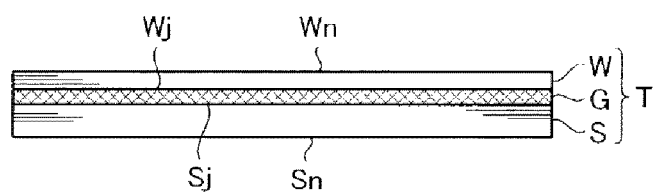
FIG. 2 is a schematic side view of a superimposed substrate.

First, a configuration of a peeling system according to a first exemplary embodiment will be described with reference to FIGS. 1 and 2. FIG. 1 is a schematic plan view illustrating a configuration of a peeling system according to an exemplary embodiment. FIG. 2 is a schematic side view of a superimposed substrate. Hereinafter, in order to clarify the positional relationship, an X-axis direction, a Y-axis direction, and a Z-axis direction which are perpendicular to each other are defined, and a positive Z-axis direction is determined as a vertically upward direction.

A system 1 according to the first exemplary embodiment, as illustrated in FIG. 1, separates a superimposed substrate T (see FIG. 2) including a substrate to be processed W (a "processing target substrate") and a supporting substrate S which are bonded to each other through an adhesive G into the processing target substrate W and the supporting substrate S. The processing target substrate W corresponds to an example of a first substrate, and the supporting substrate S corresponds to an example of a second substrate.

Hereinafter, as illustrated in FIG. 2, among the surfaces of the processing target substrate W, the surface to be bonded to the supporting substrate S through the adhesive G will be referred to as a "bonded surface Wj", and the surface opposite to the bonded surface Wj will be referred to as a "non-bonded surface Wn." Among the surfaces of the supporting substrate S, the surface to be bonded to the processing target substrate W through the adhesive G will be referred to as a "bonded surface Sj" and the surface opposite to the bonded surface Sj will be referred to as a "non-bonded surface Sn."

The processing target substrate W is a semiconductor substrate, such as, for example, a silicon wafer or a compound semiconductor wafer, on which a plurality of electronic circuits is formed in which the surface on which the electronic circuits are formed is taken as the bonded surface Wj. For example, the processing target substrate W is thinned since the non-bonded surface Wn is polished. Specifically, the thickness of the processing target substrate W ranges from about 20 µm to 100 µm.

The supporting substrate S is, for example, a substrate having substantially the same diameter as that of the processing target substrate W and supports the processing target substrate W. The thickness of the supporting substrate S ranges from about 650 µm to 750 µm. As for such a supporting substrate S, besides the silicon wafer, for example, a glass substrate may be used. The thickness of the adhesive G which bonds the processing target substrate W and the supporting substrate S to each other ranges from about 40 µm to 150 µm.

As illustrated in FIG. 1, the peeling system 1 has a configuration in which a carry-in/out station 2, a first processing station 3, a second processing station 4, and a frame mounting device 5 are integrally connected to each other. Specifically, the carry-in/out station 2 and the first processing station 3 are disposed to be aligned in the Y-axis direction. The second processing station 4 is disposed at the negative X-axis direction side of the carry-in/out station 2 and the first processing station 3, and the frame mounting device 5 is further disposed at the negative X-axis direction side of the second processing station 4.

A superimposed substrate T is carried into the carry-in/out station 2 and a separated supporting substrate S is carried out of the carry-in/out station 2.

In the carry-in/out station 2, a cassette mounting stage 10 is provided. A plurality of cassette mounting plates 11 (e.g., three cassette mounting plates 11) is disposed to be aligned in the X-axis direction on the cassette mounting stage 10, and a cassette Ct or a cassette Cs is mounted on each of the cassette mounting plates 11. The cassette Ct is a container configured to accommodate a plurality of superimposed substrates T, and the cassette Cs is a container configured to accommodate a plurality of supporting substrates S.

The number of the cassette mounting plates 11 or the kinds of cassettes to be mounted on the cassette mounting plates 11 are not limited to the example illustrated in FIG. 1.

An ID reader 12 is disposed at the positive X-axis direction side of the cassette mounting stage 10 to read out identification numbers (ID) of the superimposed substrates T.

The carry-in/out station 2 includes a conveyance section 9 between the cassette mounting stage 10 and the first processing station 3. In the conveyance section 9, a substrate conveyance device 20 is disposed to convey the superimposed substrates T or the separated supporting substrates S.

The substrate conveyance device 20 includes a conveyance arm configured to move in the horizontal direction (here, X-axis direction), to move up and down in the vertical direction and to rotate around the vertical axis, and a substrate holding unit mounted on the distal end of the conveyance arm. Using the substrate holding unit, the substrate conveyance device 20 holds a superimposed substrate T or a separated supporting substrate S, and conveys the held superimposed substrate T or the separated supporting substrate S to a desired location by the conveyance arm.

In the first processing station 3, separation of the superimposed substrates T and cleaning of the separated supporting substrates S are performed. In the first processing station 3, a plurality of peeling devices 31 and 32 (e.g., two peeling devices) and a plurality of supporting substrate cleaning devices 33 and 34 (e.g., two supporting substrate cleaning devices) are disposed in a state where the plurality of peeling devices 31 and 32 and the plurality of supporting substrate cleaning devices 33 and 34 are stacked in two upper and lower stages, respectively.

The peeling devices 31 and 32 separate the superimposed substrates T into the processing target substrates W and the supporting substrates S. The supporting substrate cleaning devices 33 and 34 clean the bonded surfaces Sj of the separated supporting substrates S to remove the adhesive G remaining on the bonded surfaces Sj.

The peeling devices 31 and 32 are disposed at a location facing the conveyance section 9 and a first conveyance device 101 of the second processing station 4 which will be described later. The supporting substrate cleaning devices 33 and 34 are disposed to face the conveyance section 9 at the positive X-axis direction side of the peeling devices 31 and 32.

In the second processing station 4, the separated processing target substrates W are cleaned and the cleaned processing target substrates W are delivered to the frame mounting device 5.

In the second processing station 4, a plurality of first cleaning devices 41, 42, and 43 (e.g., three first cleaning devices), an inversion device 44, a plurality of second cleaning devices 45 and 46 (e.g., two second cleaning devices), and temporary mounting units 47, 48, and 49 are disposed.

The first cleaning devices 41, 42, and 43 clean bonded surfaces Wj of the separated processing target substrates W. The inversion device 44 inverts the front and rear surfaces of the separated processing target substrates W. The second cleaning devices 45 and 46 clean non-bonded surfaces Wn of the separated processing target substrates W. The separated processing target substrates W are temporarily mounted on the temporary mounting units 47, 48, and 49. Also, the temporary mounting units 47, 48, and 49 are used as places where the separated processing target substrates W taken out from the peeling devices 31 and 32 are temporarily mounted when, for example, the first cleaning devices 41, 42, and 43 are broken.

The first cleaning devices 41, 42, and 43 are disposed separately in a first place D1 and a second place D2 within the second processing station 4. In the present exemplary embodiment, one first cleaning device 41 is disposed in the first place D1, and two first cleaning devices 42 and 43 are disposed in the second place D2 to be vertically stacked in two stages. The temporary mounting units 47, 48, and 49 are disposed above the first cleaning device 41. The second cleaning devices 45 and 46 are also disposed to be vertically stacked in two stages.

In the second processing station 4, the first conveyance device 101, the second conveyance device 102 and the third conveyance device 103 are further disposed.

The first conveyance device 101 takes out the separated processing target substrates W from the peeling devices 31 and 32 and conveys the processing target substrates W to the first cleaning devices 41, 42, and 43. The second conveyance device 102 takes out the separated processing target substrates W from the first cleaning devices 41, 42, and 43 and conveys the processing target substrates W to the inversion device 44. The third conveyance device 103 takes out the separated processing target substrates W from the inversion device 44 and conveys the processing target substrates W to the second cleaning devices 45 and 46, and then takes out the separated processing target substrates W from the second cleaning devices 45 and 46 and conveys the processing target substrates W to a delivery unit 51 of the frame mounting device 5 which will be described later.

The first conveyance device 101, the second conveyance device 102 and the third conveyance device 103 are conveyance devices having the same configuration, and convey the separated processing target substrates W while sucking and holding the substrates W in a non-contact manner.

Figure 3:
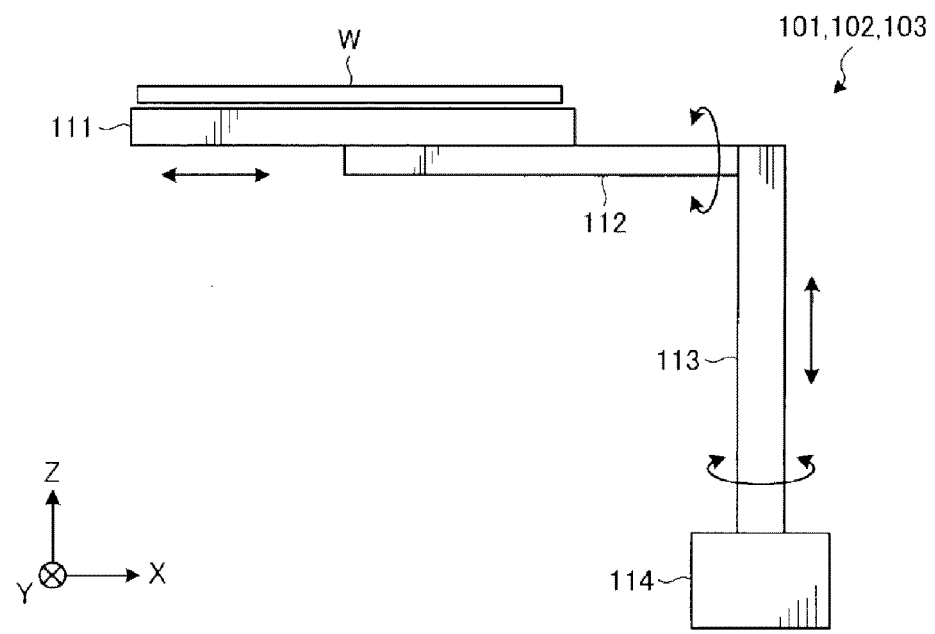
FIG. 3 is a schematic side view illustrating configurations of a first conveyance device, a second conveyance device, and a third conveyance device.

The configuration of the first conveyance device 101, the second conveyance device 102 and the third conveyance device 103 will be described with reference to FIG. 3. FIG. 3 is a schematic side view illustrating configurations of the first conveyance device 101, the second conveyance device 102 and the third conveyance device 103.

As illustrated in FIG. 3, each of the first to third conveyance devices 101 to 103 includes a Bernoulli chuck 111. The Bernoulli chuck 111 ejects a gas from a plurality of ejecting holes provided on a sucking surface toward the surface of a processing target substrate W to generate a negative pressure between the sucking surface and the surface of the processing target substrate W so that a separated processing target substrate W may be sucked and held in a non-contact manner.

Each of the first to third conveyance devices 101 to 103 includes an arm 112, a first driving unit 113, and a second driving unit 114. The arm 112 is a member extending in the horizontal direction and is configured to support the Bernoulli chuck 111 at the distal end of the arm 112.

The first driving unit 113 extends in the vertical direction to support the base end of the arm 112 at the distal end of the first driving unit 113. The first driving unit 113 rotates the arm 112 around the horizontal axis and extends and retracts the arm 112 in the horizontal direction.

The second driving unit 114 supports the base end of the first driving unit 113. The second driving unit 114 rotates the first driving unit 113 around the vertical axis, and extends and retracts the first driving unit 113 in the vertical direction.

In this manner, each of the first to third conveyance devices 101 to 103 is configured to perform extension and retraction in the horizontal direction, rotation around the vertical axis and rotation around the horizontal axis, and conveys the separated processing target substrate W while properly performing these operations.

The frame mounting device 5, as illustrated in FIG. 1, is disposed at the negative X-axis direction side of the second processing station 4. The frame mounting device 5 includes a delivery unit 51, a main body (not illustrated), and a conveyance unit (not illustrated). On the delivery unit 51, the separated processing target substrates W are placed by the third conveyance device 103. The main body mounts a reinforcing member called a dicing frame on each of the separated processing target substrates W. The conveyance unit conveys the separated processing target substrates W between the delivery unit 51 and the main body. The processing target substrates W on which the dicing frames are mounted by the frame mounting device 5 are conveyed to the outside from a carrying-out unit (not illustrated) of the frame mounting device 5.

The peeling system 1 includes a control device 6. The control device 6 is a device configured to control the operation of the peeling system 1. The control device 6 is, for example, a computer, and includes a control unit and a storage unit (not illustrated). The storage unit stores a program for controlling various processings to be executed in the peeling system 1. The control unit reads and executes the program stored in the storage unit to control the operation of the peeling system 1.

Such a program may be recorded in a computer-readable recording medium and then installed to the storage unit of the control device 6 from the recording medium. Examples of the computer-readable recording medium may include a hard disk (HD), a flexible disk (FD), a compact disk (CD), a magnetic optical disk (MO), and a memory card.

In the peeling system 1 according to the present exemplary embodiment, the arrangement layout of the first to third conveyance devices 101 to 103, the first cleaning devices 41, 42, and 43, the inversion device 44 and the second cleaning devices 45 and 46 within the second processing station 4 is devised so as to improve throughput of processings on the separated processing target substrates W.

Specifically, as illustrated in FIG. 1, the first conveyance device 101 is disposed at the negative X-axis direction side of the peeling devices 31 and 32, and the first place D1 and the second place D2 are disposed at the negative X-axis direction side and the negative Y-axis direction side of the first conveyance device 101. The second conveyance device 102 is disposed at the negative Y-axis direction side of the first place D1 and at the negative X-axis direction side of the second place D2.

That is, in the peeling system 1 according to the present exemplary embodiment, the first place D1 and the second place D2 where the first cleaning devices 41, 42, and 43 are disposed are arranged adjacent to each other while one of the first place D1 and the second place D2 is shifted in the Y-axis direction. In two empty spaces formed by the shift, which face both the first place D1 and the second place D2, the first conveyance device 101 and the second conveyance device 102 are disposed.

The inversion device 44 is disposed at the negative Y-axis direction side of the second conveyance device 102, and the third conveyance device 103 is disposed at the negative X-axis direction side of the inversion device 44. Therefore, as illustrated in FIG. 1, the first to third conveyance devices 101 to 103 are disposed to be aligned obliquely within the second processing station 4. The second cleaning devices 45 and 46 are disposed at the positive Y-axis direction side of the third conveyance device 103.

Figure 4:
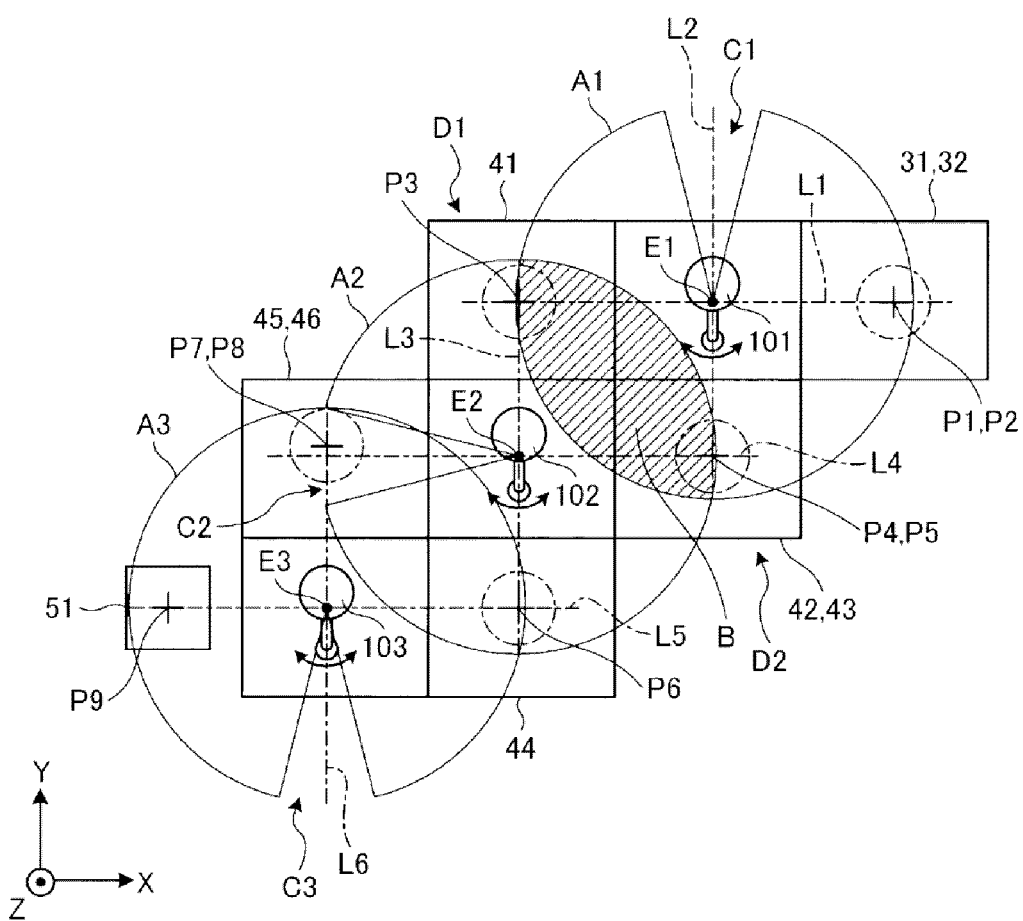
FIG. 4 is a schematic plan view illustrating a layout within a second processing station.

Hereinafter, the above described layout within the second processing station 4 will be described in more detail with reference to FIG. 4. FIG. 4 is a schematic plan view illustrating a layout within the second processing station.

A1 to A3 illustrated in FIG. 4 indicate operation ranges of the first to third conveyance devices 101 to 103, respectively. Specifically, the operation range of each of the first to third conveyance devices 101 to 103 indicates a range where the central position of the Bernoulli chuck 111 (that is, the central position of a processing target substrate W held by the Bernoulli chuck 111) reaches when each of the first to third conveyance devices 101 to 103 is rotated while the arm 112 is fully extended. The first to third conveyance devices 101 to 103 have non-rotation regions C1 to C3, and may be rotated in a range of less than 360°.

As illustrated in FIG. 4, delivery positions P1 to P9 of separated processing target substrates W are provided within the peeling devices 31 and 32, the first cleaning devices 41, 42, and 43, the inversion device 44, the second cleaning devices 45 and 46 and the delivery unit 51 of the frame mounting device 5, respectively.

The delivery positions P1 and P2 of the peeling devices 31 and 32 are arranged on a straight line L1 which is parallel to the X axis and passes through a rotation center E1 of the first conveyance device 101. The delivery position P3 of the first cleaning device 41 disposed in the first place D1 is also arranged on the straight line L1. Accordingly, the delivery positions P1 P2, and P3 and the rotation center E1 of the first conveyance device 101 are arranged on the same straight line along the X-axis direction.

The delivery positions P4 and P5 of the first cleaning devices 42 and 43 disposed in the second place D2 are arranged on a straight line L2 which is parallel to the Y axis and passes through the rotation center E1 of the first conveyance device 101.

In this manner, the delivery positions P4 and P5 of the first cleaning devices 42 and 43 disposed in the second place D2 are arranged to be aligned with the rotation center E1 of the first conveyance device 101 along a direction (the Y-axis direction) orthogonal to the arrangement direction (the X-axis direction) of the delivery position P3 of the first cleaning device 41 disposed in the first place D1 and the rotation center E1 of the first conveyance device 101 in a plan view. That is, the delivery positions P4 and P5 are arranged at a location displaced from the delivery position P3 by 90° with respect to the rotation center E1 of the first conveyance device 101. In the present exemplary embodiment, the X-axis direction is an example of a "first direction," and the Y-axis direction is an example of a "second direction."

The rotation center E2 of the second conveyance device 102 is arranged at a location where a straight line L3 and a straight line L4 intersect each other. The straight line L3 is parallel to the Y-axis and passes through the delivery position P3 of the first cleaning device 41 disposed in the first place D1, and the straight line L4 is parallel to the X-axis and passes through the delivery positions P4 and P5 of the first cleaning devices 42 and 43 disposed in the second place D2. That is, the rotation center E2 of the second conveyance device 102 is arranged at a location aligned with the delivery position P3 along the Y-axis direction, and aligned with the delivery positions P4 and P5 along the X-axis direction.

Accordingly, the delivery position P3 is arranged at a location where the straight line L1 passing through the rotation center E1 of the first conveyance device 101 and the straight line L3 passing through the rotation center E2 of the second conveyance device 102 intersect each other. The delivery positions P4 and P5 of the first cleaning devices 42 and 43 disposed in the second place D2 are arranged at a location where the straight line L2 passing through the rotation center E1 of the first conveyance device 101 and the straight line L4 passing through the rotation center E2 of the second conveyance device 102 intersect each other. Accordingly, the delivery positions P3 is arranged at a location displaced from the delivery positions P4 and P5 by 90° with respect to the rotation center E2 of the second conveyance device 102.

The delivery position P6 of the inversion device 44 is arranged on the above described straight line L3. That is, the delivery position P3 of the first cleaning device 41, the delivery position P6 of the inversion device 44, and the rotation center E2 of the second conveyance device 102 are arranged on the same straight line along the Y-axis direction.

The rotation center E3 of the third conveyance device 103 is arranged on a straight line L5 which is parallel to the X axis and passes through the delivery position P6 of the inversion device 44. The delivery positions P7 and P8 of the second cleaning devices 45 and 46 are arranged on a straight line L6 which is parallel to the Y axis and passes through the rotation center E3 of the third conveyance device 103. The delivery position P9 of the delivery unit 51 is arranged on the above described straight line L5. That is, the delivery position P6 of the inversion device 44, the delivery position P9 of the delivery unit 51, and the rotation center E3 of the third conveyance device 103 are arranged on the same straight line along the X axis. However, the delivery position P9 of the delivery unit 51 does not necessarily have to be arranged on the straight line L5.

Among these delivery positions P1 to P9, the delivery positions P1 and P2 of the peeling devices 31 and 32, the delivery position P3 of the first cleaning device 41, and the delivery positions P4 and P5 of the first cleaning devices 42 and 43 are arranged within the operation range A1 of the first conveyance device 101.

The delivery position P3 of the first cleaning device 41, the delivery positions P4 and P5 of the first cleaning devices 42 and 43, and the delivery position P6 of the inversion device 44 are arranged within the operation range A2 of the second conveyance device 102.

The delivery position P6 of the inversion device 44, the delivery positions P7 and P8 of the second cleaning devices 45 and 46, and the delivery position P9 of the delivery unit 51 are arranged within the operation range A3 of the third conveyance device 103.

As described above, in the peeling system 1 according to the present exemplary embodiment, the delivery position P3 of the first cleaning device 41 disposed in the first place D1, and the delivery positions P4 and P5 of the first cleaning devices 42 and 43 disposed in the second place D2 are arranged in a region within both the operation range A1 of the first conveyance device 101 and the operation range A2 of the second conveyance device 102, that is, a region B where the operation range A1 of the first conveyance device 101 and the operation range A2 of the second conveyance device 102 overlap each other.

Accordingly, in the peeling system 1 according to the present exemplary embodiment, both the first conveyance device 101 and the second conveyance device 102 is capable of accessing the plurality of first cleaning devices 41, 42, and 43 disposed separately in the first place D1 and the second place D2, Specifically, the first conveyance device 101 is capable of accessing the delivery position P3 of the first cleaning device 41 at the positive X-axis direction side, and the delivery positions P4 and P5 of the first cleaning devices 42 and 43 at the positive Y-axis direction side. The second conveyance device 102 is capable of accessing the delivery position P3 of the first cleaning device 41 at the negative Y-axis direction side, and the delivery positions P4 and P5 of the first cleaning devices 42 and 43 at the negative X-axis direction side.

Here, in a peeling system (hereinafter, referred to as "a conventional peeling system") disclosed in Patent Document 1, a substrate conveyance device configured to convey separated processing target substrates is moved horizontally along a rail. In contrast, the first to third conveyance devices 101 to 103 according to the present exemplary embodiment are not moved horizontally.

This is because the delivery positions P1 to P9 of the peeling devices 31 and 32, the first cleaning devices 41, 42, and 43, the inversion device 44, the second cleaning devices 45 and 46 and the delivery unit 51 are arranged within rotation ranges of the first to third conveyance devices 101 to 103. Accordingly, the first to third conveyance devices 101 to 103 may convey separated processing target substrates W without moving horizontally. In this manner, the first to third conveyance devices 101 to 103 do not have to horizontally move, and thus may convey the separated processing target substrates W in a short time as compared to the substrate conveyance device in the conventional peeling system.

Also, in the conventional peeling system, one substrate conveyance device performs both the conveyance of processing target substrates from the first cleaning device to the inversion device, and the conveyance of the processing target substrates from the inversion device to the second cleaning device. Accordingly, the substrate conveyance device in the conventional peeling system conveys the processing target substrate while sucking and holding a bonded surface of the substrate before carrying the processing target substrate into the inversion device, and conveys the processing target substrate while sucking and holding a non-bonded surface of the substrate after carrying the processing target substrate out of the inversion device.

In this manner, the substrate conveyance device in the conventional peeling system sucks and holds both a bonded surface after cleaning and a non-bonded surface before cleaning. Accordingly, when dirt is attached on the non-bonded surface of the processing target substrate, the dirt may be transferred to a sucking surface, and then transferred to a cleaned bonded surface of a following processing target substrate which is sucked and held.

In contrast, in the peeling system 1 according to the present exemplary embodiment, the second conveyance device 102 conveys processing target substrates W from the first cleaning devices 41, 42 and 43 to the inversion device 44, and the third conveyance device 103 conveys the processing target substrates W from the inversion device 44 to the second cleaning devices 45 and 46. Accordingly, the dirt of the non-bonded surface Wn of the processing target substrate W is hardly attached to a cleaned bonded surface Wj, and thus the cleanliness of the cleaned bonded surface Wj may be maintained.

In the conventional peeling system, conveyance of the processing target substrates to a frame mounting device is also performed by one substrate conveyance device as described above. In contrast, in the peeling system 1 according to the present exemplary embodiment, the third conveyance device 103 conveys the processing target substrates W from the second cleaning devices 45 and 46 to the frame mounting device 5 so as to speed up the conveyance processing of separated processing target substrates W.

As illustrated in FIG. 4, the second conveyance device 102 is arranged such that the non-rotation region C2 is directed toward the second cleaning devices 45 and 46. The second conveyance device 102 does not need to access the second cleaning devices 45 and 46. Thus, since the non-rotation region C2 is directed to these places, a dead space may be effectively used.

The non-rotation region C1 of the first conveyance device 101 is directed toward the opposite side to a location where the first cleaning devices 42 and 43 are disposed, that is, toward the positive Y-axis direction side, and the non-rotation region C3 of the third conveyance device 103 is directed toward the opposite side to a location where the second cleaning devices 45 and 46 are disposed, that is, toward the negative Y-axis direction side.

The positive Y-axis direction side of the first conveyance device 101 and the negative Y-axis direction side of the third conveyance device 103 are regions accessible by, for example, an operator. Thus, when the non-rotation regions C1 and C3 are directed to these regions, safety of, for example, the operator may be secured.

As illustrated in FIG. 1, in the peeling system 1 according to the present exemplary embodiment, the temporary mounting units 47, 48, and 49 are disposed above one first cleaning device 41 disposed in the first place D1. Accordingly, an excess space present above the first cleaning device 41 may be effectively used.

In the present exemplary embodiment, one first cleaning device 41 is disposed in the first place D1, and two first cleaning devices 42 and 43 are disposed in the second place D2. However, among three first cleaning devices 41, 42, and 43, two may be disposed in the first place D1, and one may be disposed in the second place D2. In this case, the temporary mounting units 47, 48, and 49 may be disposed above one of the first cleaning devices 41, 42, and 43 disposed in the second place D2.

Figure 5:
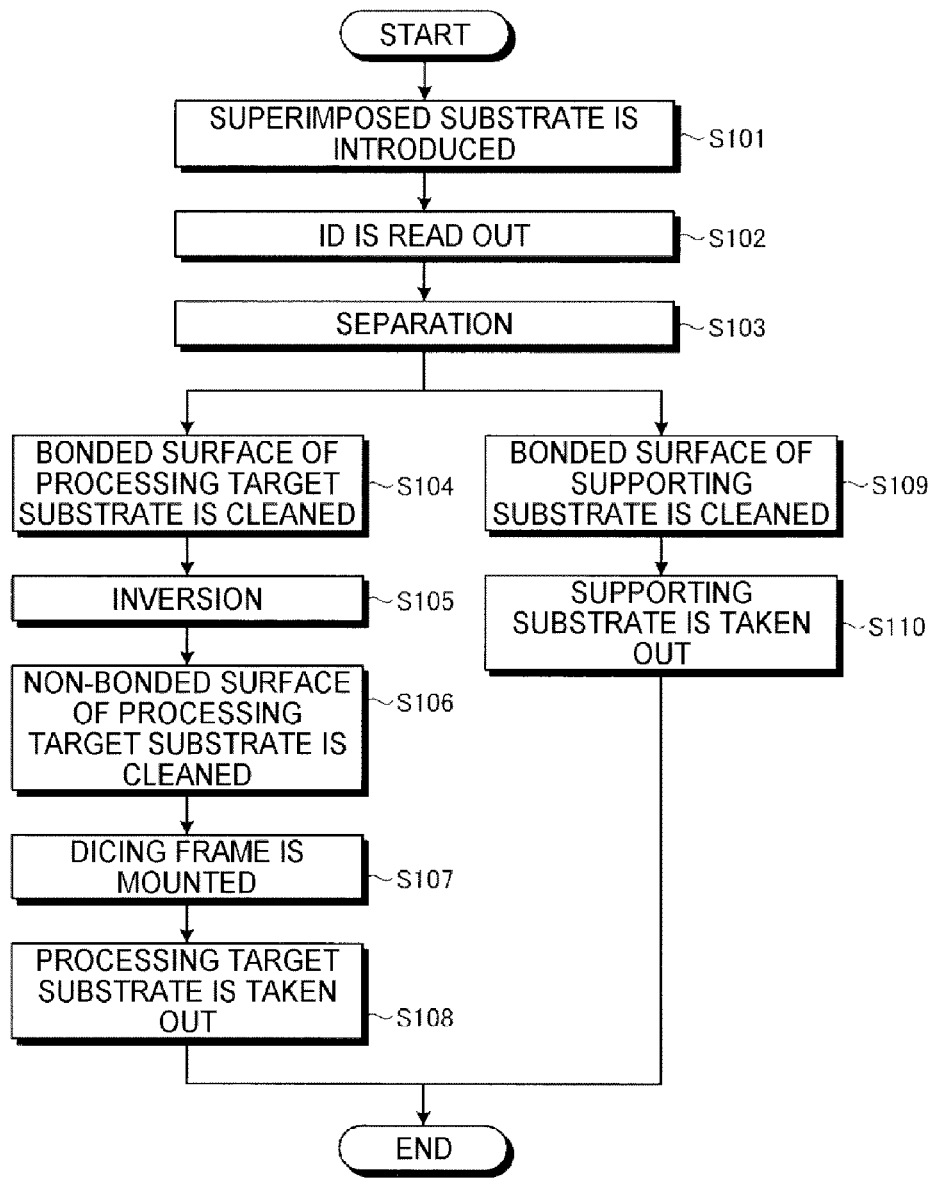
FIG. 5 is a flow chart illustrating a processing sequence of a substrate processing performed by the peeling system.

Hereinafter, an operation of the peeling system 1 according to the present exemplary embodiment will be described with reference to FIG. 5. FIG. 5 is a flow chart illustrating a processing sequence of a substrate processing performed by the peeling system 1. The peeling system 1 performs each processing sequence illustrated in FIG. 5 based on the control of the control device 6.

First, the substrate conveyance device 20 (see FIG. 1) disposed in the conveyance section 9 of the carry-in/out station 2 takes out superimposed substrates T from the cassette Ct based on the control of the control device 6, and carries the superimposed substrates T into the conveyance section 9 (step S101). The superimposed substrates T carried into the conveyance section 9 are carried into the ID reader 12 by the substrate conveyance device 20, and IDs are read out by the ID reader 12 (step S102). The IDs read out by the ID reader 12 are transmitted to the control device 6.

Subsequently, the substrate conveyance device 20 takes out the superimposed substrates T from the ID reader 12, and carries the superimposed substrates T into the peeling devices 31 and 32. Then, the peeling devices 31 and 32 perform a peeling processing based on the control of the control device 6 (step S103).

Figure 6:
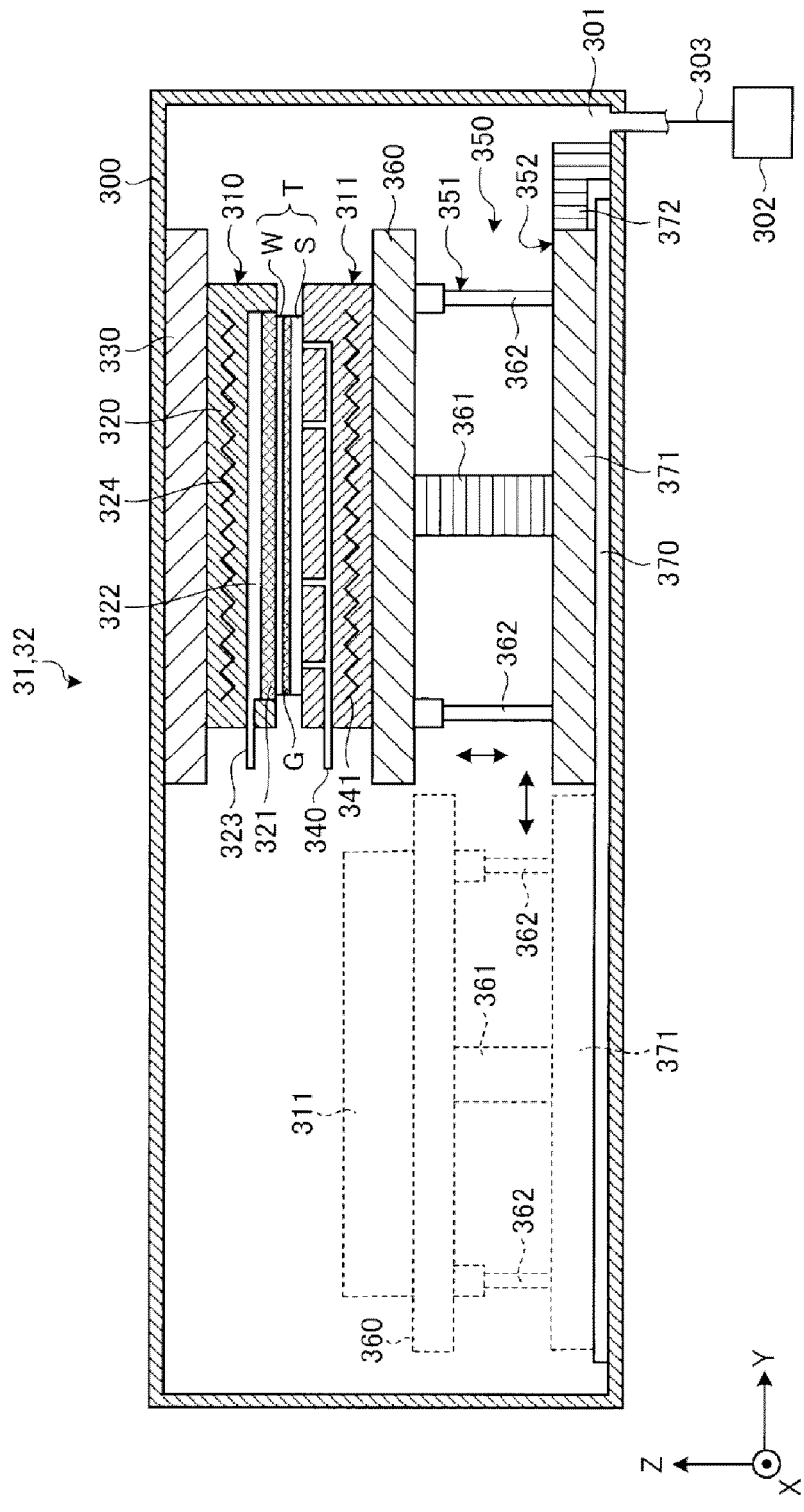
FIG. 6 is a schematic side view illustrating a configuration of a peeling device.

Hereinafter, the configuration and operation of the peeling devices 31 and 32 according to the present exemplary embodiment will be described with reference to FIG. 6. FIG. 6 is a schematic side view illustrating the configuration of the peeling devices 31 and 32.

As illustrated in FIG. 6, each of the peeling devices 31 and 32 has a case 300 within which a plurality of devices is accommodated. The case 300 includes a carry-in/out port (not illustrated) formed through each of side walls at the conveyance section 9 side and at the second processing station 4 side, and the carry-in/out port is provided with an opening/closing shutter (not illustrated).

An exhaust port 301 is formed at the bottom surface of the case 300 to evacuate the inside atmosphere. An exhaust pipe 303 is connected to the exhaust port 301 to communicate with an exhaust device 302 such as, for example, a vacuum pump. The atmosphere within the case 300 is evacuated from the exhaust port 301, thereby generating an air flow called a downflow directed vertically downward within the case 300.

A first holding unit 310 configured to suck and hold a processing target substrate W at the bottom surface thereof, and a second holding unit 311 configured to hold a supporting substrate S placed on the top surface of the second holding unit 311 are provided within the case 300. The first holding unit 310 is provided above the second holding unit 311, and is disposed to face the second holding unit 311. That is, within the case 300, the peeling processing of a superimposed substrate T is performed while the processing target substrate W is disposed at the upper side and the supporting substrate S is disposed at the lower side.

As for the first holding unit 310, for example, a porous chuck is used. The first holding unit 310 includes a flat main body 320. A porous member 321 is provided on the bottom side of the main body 320. For example, the porous member 321 has a diameter which is substantially the same as that of the processing target substrate W, and is abutted on a non-bonded surface Wn of the processing target substrate W. For example, a silicon carbide is used as for the porous member 321.

A suction space 322 is formed within the main body 320 and above the porous member 321. The suction space 322 is formed to cover, for example, the porous member 321. A suction tube 323 is connected to the suction space 322. The suction tube 323 is connected to a negative pressure generating device (not illustrated) such as, for example, a vacuum pump. The non-bonded surface Wn of the processing target substrate W is sucked through the suction space 322 and the porous member 321 from the suction tube 323, and the processing target substrate W is sucked and held by the first holding unit 310.

A heating mechanism 324 configured to heat the processing target substrate W is provided within the main body 320 and above the suction space 322. As for the heating mechanism 324, for example, a heater is used.

A support plate 330 is provided on the top of the first holding unit 310 so as to support the first holding unit 310. The support plate 330 is supported on the ceiling of the case 300. The first holding unit 310 may be supported while being abutted on the ceiling of the case 300.

A suction tube 340 is provided within the second holding unit 311 to suck and hold the supporting substrate S. The suction tube 340 is connected to a negative pressure generating device (not illustrated) such as, for example, a vacuum pump.

A heating mechanism 341 configured to heat the supporting substrate S is provided within the second holding unit 311. As for the heating mechanism 341, for example, a heater is used.

A moving mechanism 350 is provided under the second holding unit 311 to move the second holding unit 311 and the supporting substrate S in the vertical direction and the horizontal direction. The moving mechanism 350 includes a vertical moving unit 351 configured to move the second holding unit 311 in the vertical direction and a horizontal moving unit 352 configured to move the second holding unit 311 in the horizontal direction.

The vertical moving unit 351 includes a support plate 360 configured to support the bottom surface of the second holding unit 311, a drive unit 361 configured to move up and down the support plate 360, and a support member 362 configured to support the support plate 360. The drive unit 361 includes, for example, a ball screw (not illustrated) and a motor (not illustrated) that rotates the ball screw. In addition, the support member 362 is configured to be extendible and retractable in the vertical direction, and is provided at, for example, three locations between the support plate 360 and a support 371 to be described later.

The horizontal moving unit 352 includes a rail 370 extending in the horizontal direction, the support 371 mounted on the rail 370, and a drive unit 372 configured to move the support 371 along the rail 370. The drive unit 372 includes, for example, a ball screw (not illustrated) and a motor (not illustrated) that rotates the ball screw.

A lift pin (not illustrated) configured to support and lift the superimposed substrate T or the supporting substrate S at the bottom side thereof is provided below the second holding unit 311. The lift pin is inserted through a through hole (not illustrated) formed in the second holding unit 311 to be capable of protruding from the top surface of the second holding unit 311.

The peeling devices 31 and 32 configured as described above separate the superimposed substrate T conveyed by the substrate conveyance device 20 into the processing target substrate W and the supporting substrate S while heating the superimposed substrate T and shifting the processing target substrate W and the supporting substrate S along the bonded surfaces.

Specifically, the superimposed substrate T carried into the peeling devices 31 and 32 is sucked and held by the second holding unit 311. Then, the second holding unit 311 is moved up by the moving mechanism 350, and the superimposed substrate T is inserted and held between the first holding unit 310 and the second holding unit 311 as illustrated in FIG. 6. Here, the non-bonded surface Wn of the processing target substrate W is sucked and held by the first holding unit 310 and the non-bonded surface Sn of the supporting substrate S is sucked and held by the second holding unit 311.

Then, the superimposed substrate T is heated to a predetermined temperature, for example, 200° C. by the heating mechanisms 324 and 341. Then, the adhesive G within the superimposed substrate T is softened.

Subsequently, while the superimposed substrate T is heated by the heating mechanism 324 and 341 to maintain the softened state of the adhesive G, the second holding unit 311 and the supporting substrate S are moved in the vertical direction and the horizontal direction, that is, obliquely downward by the moving mechanism 350. Then, the processing target substrate W held by the first holding unit 310 and the supporting substrate S held by the second holding unit 311 are separated from each other.

The separated processing target substrate W is taken out of the peeling devices 31 and 32 by the first conveyance device 101 of the second processing station 4, and is carried into the first cleaning device 41 disposed in the first place D1 or any one of the first cleaning devices 42 and 43 disposed in the second place D2. The first cleaning devices 41, 42, and 43 clean the bonded surface Wj of the separated processing target substrate W (step S104).

Figure 7:
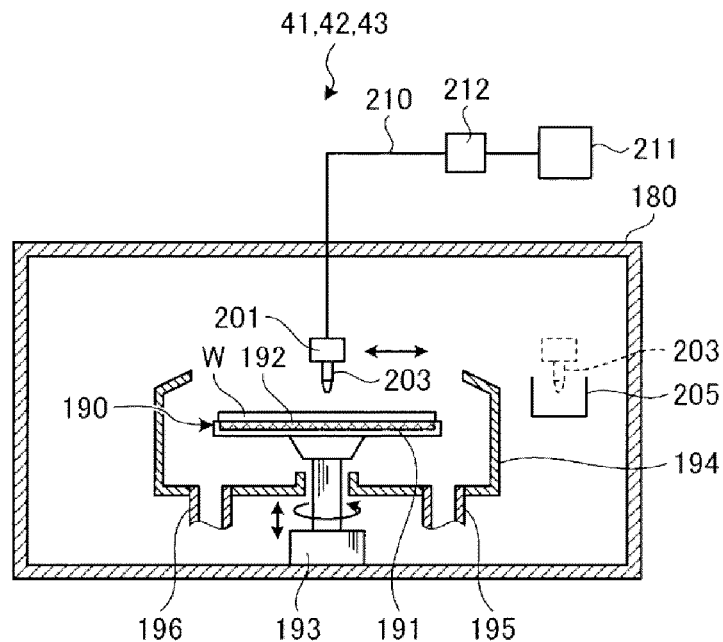
FIG. 7 is a schematic side view illustrating a configuration of a first cleaning device.
Figure 8:
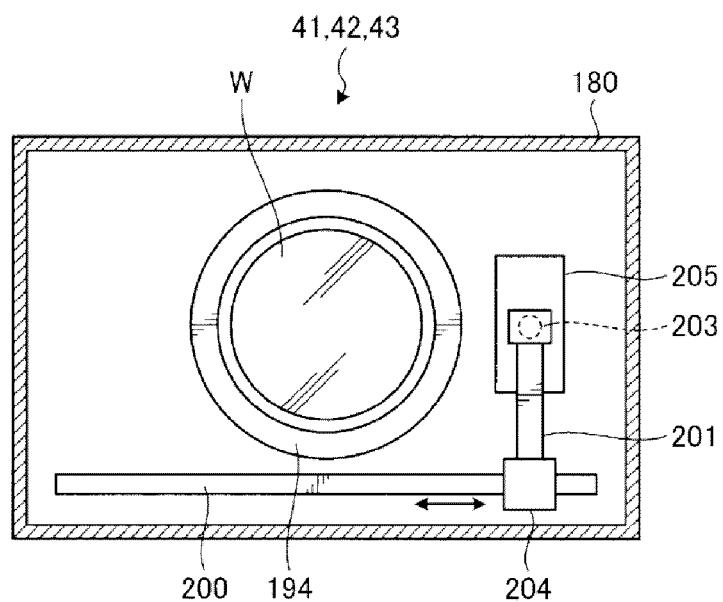
FIG. 8 is a schematic plan view illustrating the configuration of the first cleaning device.

Hereinafter, the configuration and operation of the first cleaning devices 41, 42, and 43 will be described with reference to FIGS. 7 and 8. FIG. 7 is a schematic side view illustrating the configuration of the first cleaning devices 41, 42, and 43, and FIG. 8 is a schematic plan view of the same configuration.

As illustrated in FIG. 7, each of the first cleaning devices 41, 42, and 43 includes a case 180. The case 180 includes a carry-in/out port (not illustrated) of separated processing target substrates W in each of side walls at the first conveyance device 101 side and at the second conveyance device 102 side, and the carry-in/out port is provided with an opening/closing shutter (not illustrated).

In the central portion of the case 180, a porous chuck 190 is provided to hold and rotate the processing target substrate W. The porous chuck 190 includes a flat main body 191, and a porous member 192 provided on the top of the main body 191. The porous member 192 has a diameter which is substantially the same as, for example, that of the processing target substrate W and is abutted on the non-bonded surface Wn of the processing target substrate W. As for the porous member 192, for example, a silicon carbide is used. A suction tube (not illustrated) is connected to the porous member 192. The non-bonded surface Wn of the processing target substrate W is sucked through the porous member 192 from the suction tube so that the processing target substrate W may be sucked and held on the porous chuck 190.

A chuck drive unit 193 including, for example, a motor, is provided below the porous chuck 190. The porous chuck 190 may be rotated at a predetermined speed by the chuck drive unit 193. Further, the chuck drive unit 193 is provided with a lift drive source such as, for example, a cylinder, so that the porous chuck 190 may be lifted.

A cup 194 is provided around the porous chuck 190 to receive and recover a liquid scattered or dropped from the processing target substrate W. A discharge tube 195 configured to discharge the recovered liquid and an exhaust pipe 196 configured to evacuate the atmosphere within the cup 194 to a vacuum state are connected to the bottom of the cup 194. Within the case 180, an air flow called a downflow directed vertically downward is generated. The exhaust pipe 196 also evacuates the atmosphere within the, case 180.

As illustrated in FIG. 8, a rail 200 extending in the horizontal direction is formed outside the cup 194. An arm 201 is mounted on the rail 200.

As illustrated in FIGS. 7 and 8, the arm 201 supports a cleaning liquid nozzle 203 configured to supply a cleaning liquid, for example, an organic solvent, to the separated processing target substrate W. The arm 201 may be moved on the rail 200 by a nozzle drive unit 204 illustrated in FIG. 8. Accordingly, the cleaning liquid nozzle 203 may be moved from a standby section 205 provided outside the cup 194 to a position above the central portion of the processing target substrate W within the cup 194, and may also be moved above the processing target substrate W in the radial direction of the processing target substrate W. The arm 201 may be lifted by the nozzle drive unit 204 so that the height of the cleaning liquid nozzle 203 may be adjusted.

A supply tube 210 is connected to the cleaning liquid nozzle 203 to supply a cleaning liquid to the cleaning liquid nozzle 203, as illustrated in FIG. 7. The supply tube 210 is communicated with a cleaning liquid supply source 211 which stores the cleaning liquid therein. The supply tube 210 is provided with a supply device group 212 that includes, for example, a valve or a flow control unit that controls the flow of the cleaning liquid.

Under the porous chuck 190, a lift pin (not illustrated) may be provided so as to support and lift the processing target substrate W at the bottom side. In such a case, the lift pin is inserted through a through hole (not illustrated) formed in the porous chuck 190 to be capable of protruding from the top surface of the porous chuck 190. Instead of the porous chuck 190, the lift pin is lifted so as to deliver the processing target substrate W to and from the porous chuck 190.

The first cleaning devices 41, 42, and 43 are configured as described above and clean the bonded surfaces Wj of the separated processing target substrates W based on the control of the control device 6.

Specifically, the first conveyance device 101 places the separated processing target substrate W sucked and held by the Bernoulli chuck 111 on the porous chuck 190 of each of the first cleaning devices 41, 42, and 43. Here, the first conveyance device 101 rotates the arm 112 around the horizontal axis to invert the Bernoulli chuck 111, and places the separated processing target substrate W on the porous chuck 190. Accordingly, the separated processing target substrate W is placed on the porous chuck 190 while the bonded surface Wj is upward.

Each of the first cleaning devices 41, 42, and 43 sucks and holds the processing target substrate W by the porous chuck 190, and moves down the porous chuck 190 to a predetermined position. Subsequently, the cleaning liquid nozzle 203 is moved from the standby section 205 to a position above the central portion of the processing target substrate W by the arm 201. Then, the processing target substrate W is rotated by the porous chuck 190 while the cleaning liquid is supplied to the bonded surface Wj of the processing target substrate W from the cleaning liquid nozzle 203. The supplied cleaning liquid is diffused over the entire surface of the bonded surface Wj of the processing target substrate W by a centrifugal force to clean the bonded surface Wj.

When the first cleaning devices 41, 42, and 43 are broken, the first conveyance device 101 takes out the separated processing target substrates W from the peeling devices 31 and 32, and carries the separated processing target substrates W into the temporary mounting units 47, 48, and 49. Accordingly, even if the first cleaning devices 41, 42, and 43 are broken, the peeling processing may be performed on at least the number of sheets of the processing target substrates W which can be accommodated in the temporary mounting units 47, 48, and 49. Thus, it is possible to suppress the separated processing target substrates W from being left within the peeling devices 31 and 32 and being excessively heated.

When cleaning of the bonded surface Wj is finished by each of the first cleaning devices 41, 42, and 43, the second conveyance device 102 takes out the processing target substrate W from each of the first cleaning devices 41, 42, and 43 and carries the processing target substrate W into the inversion device 44.

Specifically, the second conveyance device 102 extends the arm 112 and advances the Bernoulli chuck 111 into each of the first cleaning devices 41, 42, and 43 at the carry-in/out port (not illustrated) of each of the first cleaning devices 41, 42, and 43 so that the separated processing target substrate W is sucked and held. Here, the Bernoulli chuck 111 sucks and holds the processing target substrate W at the bonded surface Wj side. Then, the second conveyance device 102 shortens the arm 112 to retreat the Bernoulli chuck 111 from each of the first cleaning devices 41, 42, and 43.

Subsequently, the second conveyance device 102 rotates the first driving unit 113 around the vertical axis so that the Bernoulli chuck 111 faces the inversion device 44. Then, the second conveyance device 102 lengthens the arm 112 and advances the Bernoulli chuck 111 into the inversion device 44 at the carry-in/out port (not illustrated) of the inversion device 44 so that the separated processing target substrate W is delivered to the inversion device 44 at the delivery position P6 of the inversion device 44.

As described above, the second conveyance device 102, unlike a substrate conveyance device provided in a conventional peeling system, does not move horizontally but conveys the separated processing target substrates W from the first cleaning devices 41, 42, and 43 to the inversion device 44 according to the extension and retraction of the arm 112 and the rotation around the vertical axis. Accordingly, it is possible to speed up the conveyance of the separated processing target substrates W from the first cleaning devices 41, 42, and 43 to the inversion device 44.

The inversion device 44 inverts the front and rear surfaces of the separated processing target substrate W carried into the inversion device 44 by the second conveyance device 102 (step S105). Specifically, the separated processing target substrate W is delivered to a first holding unit of the inversion device 44 while the bonded surface Wj is upward. The first holding unit is, for example, a Bernoulli chuck and is configured to suck and hold the processing target substrate W at the non-bonded surface Wn side. Then, the inversion device 44 inverts the first holding unit to invert the front and rear surfaces of the processing target substrate W held by the first holding unit, and then shifts the inverted processing target substrate W from the first holding unit to the second holding unit. The second holding unit is also, for example, a Bernoulli chuck and is configured to suck and hold the processing target substrate W at the bonded surface Wj side. Accordingly, the non-bonded surface Wn of the separated processing target substrate W is upward, and the bonded surface Wj side is sucked and held.

Subsequently, the third conveyance device 103 takes out the inverted processing target substrate W from the inversion device 44 and carries the processing target substrate W into each of the second cleaning devices 45 and 46.

Here, the third conveyance device 103, like the second conveyance device 102, does not move horizontally but conveys the processing target substrates W from the inversion device 44 to the second cleaning devices 45 and 46 according to the extension and retraction of the arm 112 and the rotation around the vertical axis. Accordingly, it is possible to speed up the conveyance of the separated processing target substrates W from the inversion device 44 to the second cleaning devices 45 and 46.

Each of the second cleaning devices 45 and 46 cleans the non-bonded surface Wn of the separated processing target substrate W carried by the third conveyance device 103 (step S106).

The configuration of the second cleaning devices 45 and 46 is substantially the same as the above described configuration of the first cleaning devices 41, 42, and 43. In the second cleaning devices 45 and 46, unlike the cleaning processing performed in the first cleaning devices 41, 42, and 43 in which a cleaning liquid such as an organic solvent is supplied by the cleaning liquid nozzle 203, a scrub cleaning processing is performed in which, for example, a rotatory brush or sponge comes in contact with the substrate surface to remove the foreign matters adhered on the surface.

Subsequently, the third conveyance device 103 takes out the processing target substrate W with the cleaned non-bonded surface Wn from each of the second cleaning devices 45 and 46 and carries the processing target substrate W into the delivery unit 51 of the frame mounting device 5.

Also, in this case, the third conveyance device 103 does not move horizontally but conveys the processing target substrates W from the second cleaning devices 45 and 46 to the delivery unit 51 of the frame mounting device 5 by the extension and retraction of the arm 112 and the rotation around the vertical axis. Accordingly, it is possible to speed up the conveyance of the separated processing target substrates W from the second cleaning devices 45 and 46 to the delivery unit 51 of the frame mounting device 5.

The frame mounting device 5 mounts a dicing frame on the processing target substrate W placed on the delivery unit 51 (step S107). The processing target substrate W on which the dicing frame is mounted by the frame mounting device 5 is carried from a carry-out port (not illustrated) of the frame mounting device 5 to the outside (step S108). In this manner, the processing on the processing target substrates W is completed.

Meanwhile, in the peeling system 1, in parallel with the above described processings of steps S104 to S108, the processings of steps S109 and S110 are performed.

Specifically, the substrate conveyance device 20 of the carry-in/out station 2 take out separated supporting substrates S from the peeling devices 31 and 32 and carries the supporting substrates S into the supporting substrate cleaning devices 33 and 34. Then, the supporting substrate cleaning devices 33 and 34 clean bonded surfaces Sj of the separated supporting substrates S (step S109). The configuration and operation of the supporting substrate cleaning devices 33 and 34 are the same as those in the above described first cleaning devices 41, 42, and 43, and thus descriptions thereof will be omitted.

Then, the substrate conveyance device 20 takes out the cleaned supporting substrates S from the supporting substrate cleaning devices 33 and 34 and accommodates the supporting substrates S in the cassette Cs placed on the cassette mounting plate 11. The supporting substrates S accommodated in the cassette Cs are carried from the cassette mounting stage 10 to the outside, and recovered (step S110). In this manner, the processing on the supporting substrates S is completed.

Figure 9:
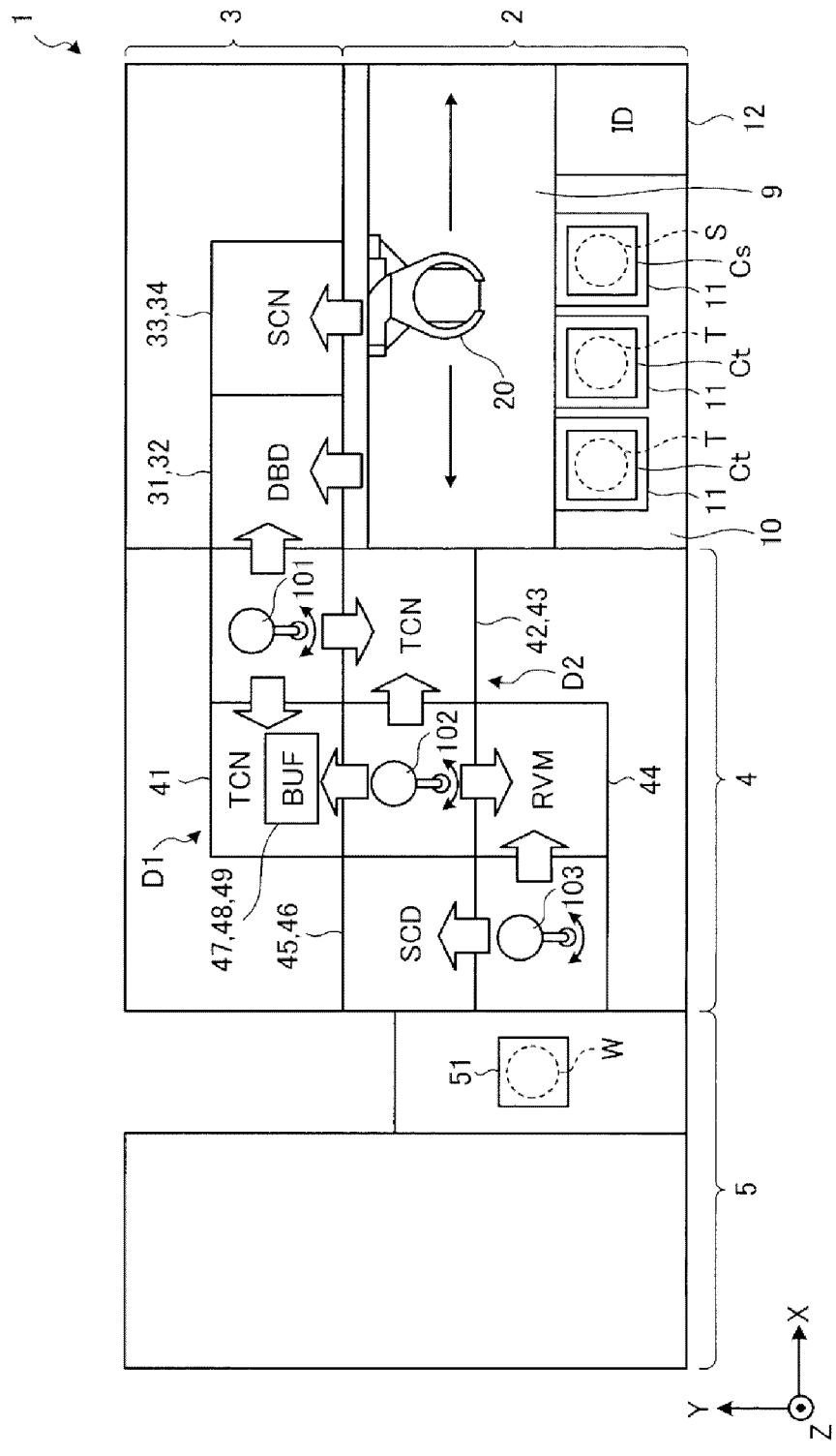
FIG. 9 is an explanatory view of an air flow generated in the peeling system.

Hereinafter, the air flow generated in the peeling system 1 will be described with reference to FIG. 9. FIG. 9 is an explanatory view of an air flow generated in the peeling system 1. The arrows illustrated in FIG. 9 indicate a direction of the air flow.

As illustrated in FIG. 9, in the peeling system 1, the pressure of a conveyance system such as the substrate conveyance device 20 or the first to third conveyance devices 101 to 103 is set to be higher than the pressure within the processing device such as the peeling devices 31 and 32 or the first cleaning devices 41, 42 and 43.

Specifically, in the peeling system 1, the pressure within the conveyance section provided with the first to third conveyance devices 101 to 103 becomes the highest. For this reason, the pressure within the peeling devices 31 and 32, the first cleaning devices 41, 42 and 43, the inversion device 44 and the second cleaning devices 45 and 46 becomes a negative pressure with respect to the pressure within the conveyance section of the first to third conveyance devices 101 to 103. Accordingly, when opening/closing shutters (not illustrated) of the peeling devices 31 and 32, the first cleaning devices 41, 42, and 43, the inversion device 44 and the second cleaning devices 45 and 46 are opened, an air flow occurs from the conveyance section of the first to third conveyance devices 101 to 103 toward the peeling devices 31 and 32, the first cleaning devices 41, 42, and 43, the inversion device 44 and the second cleaning devices 45 and 46.

The pressure within the conveyance section 9 is set to be a positive pressure with respect to the pressure within the first processing station 3. Accordingly, when opening/closing shutters (not illustrated) of the peeling devices 31 and 32 and the supporting substrate cleaning devices 33 and 34 are opened, an air flow occurs from the conveyance section 9 toward the peeling devices 31 and 32 and the supporting substrate cleaning devices 33 and 34.

As described above, the peeling system according to the present exemplary embodiment separates a superimposed substrate including a first substrate and a second substrate which are bonded to each other into the first substrate and the second substrate. The peeling system includes a peeling device, a plurality of first cleaning devices, an inversion device, a second cleaning device, a first conveyance device, a second conveyance device, and a third conveyance device. The peeling device separates the superimposed substrate into the first substrate and the second substrate. The plurality of first cleaning devices cleans the bonded surface of the separated first substrate which was bonded to the second substrate. The inversion device inverts the front and rear surfaces of the separated first substrate. The second cleaning device cleans the non-bonded surface of the separated first substrate. The first conveyance device takes out the separated first substrate from the peeling device, and conveys the first substrate to the first cleaning devices by the rotation around the vertical axis and the extension and retraction in the horizontal direction. The second conveyance device takes out the separated first substrate from the first cleaning devices, and conveys the first substrate to the inversion device by the rotation and the extension and retraction. The third conveyance device takes out the separated first substrate from the inversion device, and conveys the first substrate to the second cleaning device by the rotation and the extension and retraction.

In the peeling system according to the present exemplary embodiment, delivery positions of the separated first substrates in the plurality of first cleaning devices are arranged in a region where the operation range of the first conveyance device and the operation range of the second conveyance device overlap each other. Accordingly, according to the peeling system of the present exemplary embodiment, the throughput may be improved.

(Another Exemplary Embodiments)

Figure 10:
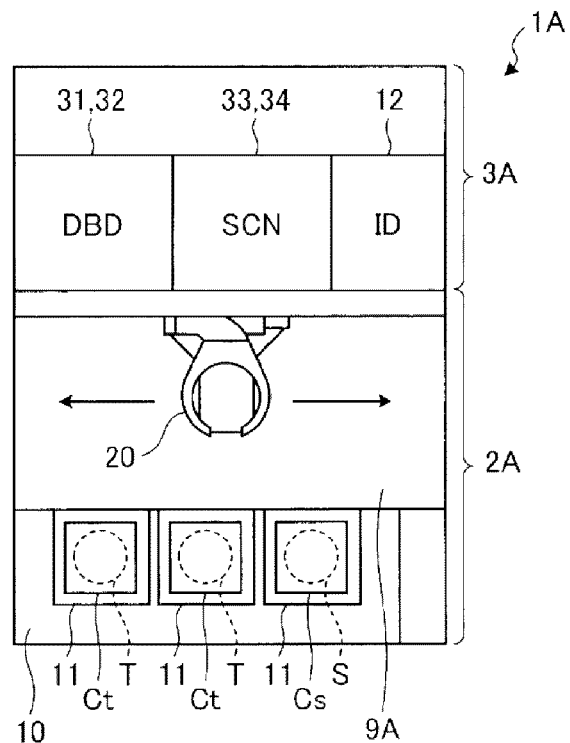
FIG. 10 is a schematic plan view illustrating another configuration of the peeling system.
Figure 11:
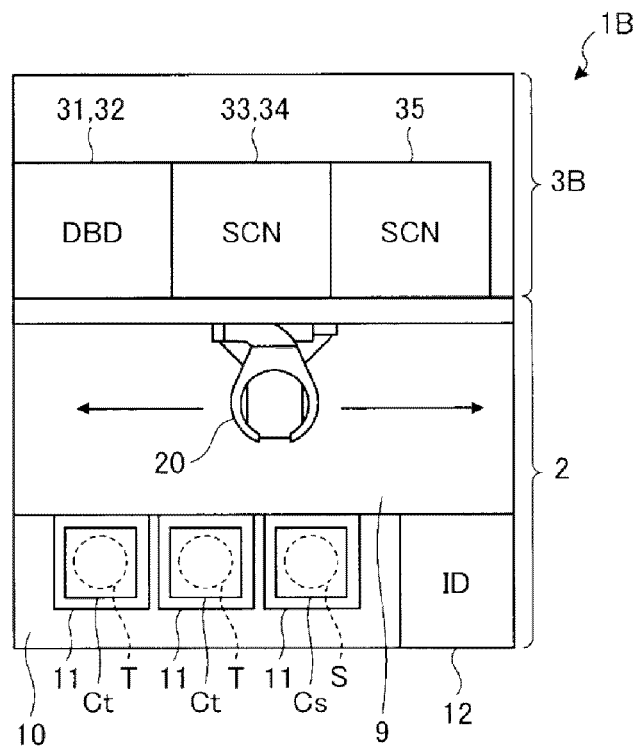
FIG. 11 is a schematic plan view illustrating a further configuration of the peeling system.

The configuration of the peeling system is not limited to the configuration illustrated in the above described exemplary embodiment. Hereinafter, other configuration examples of the peeling system will be described with reference to FIGS. 10 and 11. FIGS. 10 and 11 are schematic plan views illustrating other configuration examples of the peeling system. FIGS. 10 and 11 illustrate only a carry-in/out station and a first processing station in the peeling system.

In the peeling system 1 illustrated in FIG. 1, an empty space is present next to the supporting substrate cleaning devices 33 and 34 of the first processing station 3. Therefore, for example, like in a first processing station 3A provided in a peeling system 1A illustrated in FIG. 10, an ID reader 12 may be disposed in the empty space. Accordingly, as compared to the peeling system 1 illustrated in FIG. 1, the length dimension of a conveyance section 9A of a carry-in/out station 2A and a first processing station 3A may be shortened.

Also, like in a first processing station 3B provided in a peeling system 1B illustrated in FIG. 11, a supporting substrate cleaning device 35 may be disposed in the empty space.

In the above described exemplary embodiment, the peeling device employs a method of performing separation by shifting horizontally a processing target substrate W and a supporting substrate S of a superimposed substrate T along bonded surfaces, but the method used for the peeling device is not limited thereto. For example, the peeling device may employ a method of separating a processing target substrate W from a supporting substrate S by moving vertically a part of the outer periphery of the supporting substrate S with respect to a bonded surface Wj of the processing target substrate W in a separation direction.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A peeling system for separating a superimposed substrate including a first substrate bonded to a second substrate into the first substrate and the second substrate, the peeling system comprising:
    a peeling device configured to separate the superimposed substrate into the first substrate and the second substrate;
    a plurality of first cleaning devices each being configured to clean a bonded surface of the first substrate which was bonded to the second substrate;
    an inversion device configured to invert front and rear surfaces of the first substrate;
    a plurality of second cleaning devices each being configured to clean a non-bonded surface of the first substrate;
    a first conveyance device configured to take out the first substrate from the peeling device and convey the first substrate into one or more of the plurality of first cleaning devices by rotation around a vertical axis and extension and retraction in a horizontal direction;
    a second conveyance device configured to take out the first substrate from the one or more of the plurality of first cleaning devices and convey the first substrate into the inversion device by the rotation and the extension and retraction; and
    a third conveyance device configured to take out the first substrate from the inversion device and convey the first substrate into one or more of the plurality of second cleaning devices by the rotation and the extension and retraction,
    wherein delivery positions of the first substrate in the plurality of first cleaning devices are arranged in a region where an operation range of the first conveyance device and an operation range of the second conveyance device overlap each other,
    the plurality of first cleaning devices is further configured to be disposed separately in a first place and a second place different from the first place,
    the first conveyance device is further configured to be disposed such that a non-rotation region thereof is directed toward a positive second direction which is perpendicular to a first direction in a plan view, the first direction being an arrangement direction of the peeling device, the first conveyance device and the first place,
    the second conveyance device is further configured to be disposed such that a non-rotation region is directed toward the plurality of second cleaning devices, and
    the third conveyance device is further configured to be disposed such that a non-rotation region thereof is directed toward a negative second direction.

2. The peeling system of claim 1,
    wherein the first conveyance device is disposed between the peeling device and the first place,
    the second place is arranged to be aligned with the first conveyance device along the second direction, and
    the second conveyance device is disposed at a location aligned with the first place along the second direction and aligned with the second place along the first direction.

3. The peeling system of claim 2, wherein the inversion device is disposed to be aligned with the second conveyance device along the second direction at a side of the second conveyance device which is opposite to a side where the first place is arranged,
    the third conveyance device is disposed to be aligned with the inversion device along the first direction, and
    the plurality of second cleaning devices are disposed to be aligned with the third conveyance device along the second direction.

4. The peeling system of claim 1, wherein one of the plurality of first cleaning devices is disposed in one of the first place and the second place, and two of the plurality of first cleaning devices are disposed to be stacked in the other.

5. The peeling system of claim 4, further comprising a temporary mounting unit configured to temporarily mount the first substrate after separation,
    wherein the temporary mounting unit is disposed above one of the plurality of first cleaning devices disposed in the first place or the second place.

6. The peeling system of claim 5, wherein the plurality of first cleaning devices, the inversion device, the plurality of second cleaning devices and the plurality of temporary mounting units are disposed in a second processing station, and
    the peeling device and a second substrate cleaning device disposed next to the peeling device are disposed in a first processing station which is disposed at a positive first direction side of the second processing station.

7. The peeling system of claim 6, wherein an empty space is provided next to the second substrate cleaning device of the first processing station, and an ID reader is provided in the empty space.

8. The peeling system of claim 7, wherein another second substrate cleaning device is provided in the empty space.

9. The peeling system of claim 1, further comprising a frame mounting device configured to mount a dicing frame on the first substrate after separation,
    wherein a delivery position of the first substrate in the frame mounting device is arranged within an operation range of the third conveyance device.

10. The peeling system of claim 1, wherein the first conveyance device, the second conveyance device, and the third conveyance device eject a gas to generate a negative pressure between the first substrate and the first conveyance device, and between the second conveyance device and the third conveyance device so that the first substrate is held in a non-contact manner.

\* \* \* \* \*